(12) United States Patent
Huang et al.

(10) Patent No.: US 11,715,668 B2
(45) Date of Patent: Aug. 1, 2023

(54) INTEGRATED ANTENNA ON INTERPOSER SUBSTRATE

(71) Applicant: Taiwan Semiconductor Manufacturing Company, Ltd., Hsin-Chu (TW)

(72) Inventors: Bo-Jr Huang, Tainan (TW); William Wu Shen, Hsinchu (TW); Chin-Her Chien, Chung-Li (TW); Chin-Chou Liu, Xinfeng Township (TW); Yun-Han Lee, Baoshan Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 129 days.

(21) Appl. No.: 17/371,438

(22) Filed: Jul. 9, 2021

(65) Prior Publication Data
US 2021/0335668 A1     Oct. 28, 2021

Related U.S. Application Data

(63) Continuation of application No. 16/906,007, filed on Jun. 19, 2020, now Pat. No. 11,075,116, which is a
(Continued)

(51) Int. Cl.
*H01Q 1/48* (2006.01)
*H01L 21/768* (2006.01)
(Continued)

(52) U.S. Cl.
CPC ...... *H01L 21/76898* (2013.01); *H01L 21/486* (2013.01); *H01L 23/49827* (2013.01); *H01L 23/66* (2013.01); *H01Q 1/2283* (2013.01); *H01Q 1/48* (2013.01); *H01Q 9/0407* (2013.01); *H01L 23/481* (2013.01); *H01L 24/13* (2013.01); *H01L 24/16* (2013.01); *H01L 2223/6677* (2013.01); *H01L 2224/131* (2013.01);
(Continued)

(58) Field of Classification Search
CPC ........................................................ H01Q 1/48
See application file for complete search history.

(56) References Cited

U.S. PATENT DOCUMENTS 8,319,689 B2    11/2012  Kim et al.
2007/0080888 A1  4/2007  Mohamadi
(Continued)

OTHER PUBLICATIONS

"What, Why and How of Through-Silicon Vias" Mentor Graphics Corp., SOCcentral, Jun. 5, 2012, p. 1-4.
(Continued)

*Primary Examiner* — Graham P Smith
(74) *Attorney, Agent, or Firm* — Eschweiler & Potashnik, LLC

(57) ABSTRACT

The present disclosure relates to a semiconductor module. The semiconductor module includes an excitable element located on a first side of a substrate. A first ground structure is disposed between the first side of the substrate and the excitable element. The first ground structure includes a conductive via extending through the substrate and an interconnect disposed over a topmost surface of the conductive via facing away from the substrate. A second ground structure is located on a second side of the substrate, opposing the first side, and electrically coupled to the first ground structure.

20 Claims, 5 Drawing Sheets

Related U.S. Application Data continuation of application No. 16/210,094, filed on Dec. 5, 2018, now Pat. No. 10,692,763, which is a continuation of application No. 15/710,368, filed on Sep. 20, 2017, now Pat. No. 10,163,708, which is a continuation of application No. 13/778,528, filed on Feb. 27, 2013, now Pat. No. 9,779,990.

(51) Int. Cl.

| | | |
|---|---|---|
| *H01L 23/498* | (2006.01) | |
| *H01L 21/48* | (2006.01) | |
| *H01L 23/66* | (2006.01) | |
| *H01Q 1/22* | (2006.01) | |
| *H01Q 9/04* | (2006.01) | |
| *H01L 23/48* | (2006.01) | |
| *H01L 23/00* | (2006.01) | |

(52) U.S. Cl.
CPC ............ *H01L 2224/16225* (2013.01); *H01L 2924/1423* (2013.01); *H01L 2924/157* (2013.01); *H01L 2924/15311* (2013.01); *H01L 2924/15788* (2013.01)

(56) References Cited

U.S. PATENT DOCUMENTS

| | | |
|---|---|---|
| 2010/0193935 A1 | 8/2010 | Lachner et al. |
| 2012/0068896 A1 | 3/2012 | White et al. |
| 2012/0153433 A1 | 6/2012 | Yen et al. |
| 2014/0008773 A1 | 1/2014 | Yen et al. |

OTHER PUBLICATIONS

D. Orban, et al., "The Basics of Patch Antennas", Orban Microwave Products, www.orbanmicrowaveproducts.com, Jul. 5, 2012, p. 1-9.
U.S. Appl. No. 13/541,937, filed Jul. 5, 2012.
Office Action dated Nov. 14, 2013 for U.S. Appl. No. 13/541,937.
Notice of Allowance dated Feb. 11, 2014 for U.S. Appl. No. 13/541,937. 16 Pages.
Non Final Office Action dated Aug. 10, 2015 U.S. Appl. No. 14/287,338.
Notice of Allowance dated Nov. 25, 2015 U.S. Appl. No. 14/287,338.
Non-Final Office Action dated Jun. 29, 2015 for U.S. Appl. No. 13/778,528.
Final Office Action dated Dec. 7, 2015 for U.S. Appl. No. 13/778,528.
Notice of Allowance dated Jun. 5, 2017 for U.S. Appl. No. 13/778,528.
Non-Final Office Action dated Jan. 12, 2018 for U.S. Appl. No. 15/710,368.
Final Office Action dated May 18, 2018 for U.S. Appl. No. 15/710,368.
Notice of Allowance dated Sep. 7, 2018 for U.S. Appl. No. 15/710,368.
Non-Final Office Action dated Jun. 27, 2019 for U.S. Appl. No. 16/210,094.
Final Office Action dated Dec. 9, 2019 for U.S. Appl. No. 16/210,094.
Notice of Allowance dated Feb. 21, 2020 for U.S. Appl. No. 16/210,094.
Non-Final Office Action dated Jan. 7, 2021 for U.S. Appl. No. 16/906,007.
Notice of Allowance dated Mar. 22, 2021 for U.S. Appl. No. 16/906,007.

INTEGRATED ANTENNA ON INTERPOSER SUBSTRATE

REFERENCE TO RELATED APPLICATIONS

This Application is a Continuation of U.S. application Ser. No. 16/906,007, filed on Jun. 19, 2020, which is a Continuation of U.S. application Ser. No. 16/210,094, filed on Dec. 5, 2018 (now U.S. Pat. No. 10,692,763, issued on Jun. 23, 2020), which is a Continuation of U.S. application Ser. No. 15/710,368, filed on Sep. 20, 2017 (now U.S. Pat. No. 10,163,708, issued on Dec. 25, 2018), which is a Continuation of U.S. application Ser. No. 13/778,528, filed on Feb. 27, 2013 (now U.S. Pat. No. 9,779,990, issued on Oct. 3, 2017). The contents of the above-referenced Patent Applications are hereby incorporated by reference in their entirety.

BACKGROUND

Many modern day electronic devices comprise integrated chips that use antennas to communicate wirelessly with other electronic devices. Integrated chips can use off-chip antennas or on-chip, integrated antennas. Off-chip antennas are external components connected to an integrated chip. Integrated antennas are built within the integrated chip. For example, integrated antennas (e.g., thin film micro-strip antennas) used in high frequency wireless communication devices (e.g., devices operating in the millimeter region of the electromagnetic spectrum) often use planar antennas disposed on a high frequency substrate or high frequency printed circuit board (HF PCBs).

Over the past decade there has been an increased demand for internet and wireless communications in handheld devices (e.g., tablet PCs and smart phones). Modern handheld devices tend to be smaller, thinner, and lighter since physical size often determines the competitiveness of a product. Therefore, in modern handheld devices a radio frequency (RF) system-in-package (SiP) module having an antenna implemented with off-chip components may be disadvantageous due to the large area of the off-chip components. Furthermore, off-chip antennas also suffer from poor performance because of impedance mismatch between an integrated chip and the antenna.

DETAILED DESCRIPTION

Figure 1:
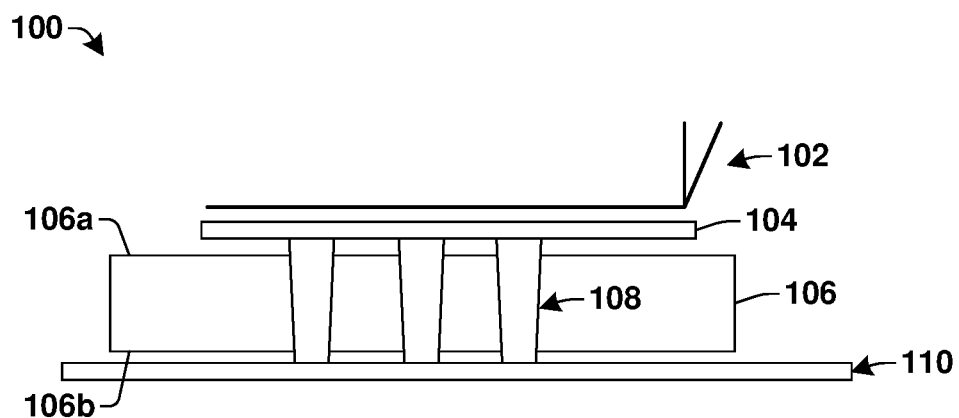
FIG. 1 illustrates a block diagram of some embodiments of a semiconductor module comprising a disclosed integrated antenna structure.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

On-chip, integrated antenna designs obviate impedance mismatch issues. However, to operate properly, on-chip antenna designs typically use a large ground reference plane. For example, a common thin film micro-strip (TFM) integrated antenna comprises a lower metal layer and an upper metal layer disposed above the lower metal layer. At least a part of the lower metal layer is configured to operate as a grounded element (i.e., a ground plane) and the upper metal layer is configured to operate as an excited element. During operation, the lower and upper metal layers are biased in a manner that forms an electrical field therebetween, which radiates as a wireless signal from the TFM integrated antenna. Using a lower metal level, located on a lossy CMOS substrate (e.g., having a high signal attenuation of approximately 10 Siemens/meter), as a ground plane avoids high loss of signal in the CMOS substrate. However, for proper operation, the ground plane requires the lower metal layer to extend over a large physical area that increases the cost of the antenna.

The present disclosure provides for a low-cost integrated antenna that uses a conductive backside structure in conjunction with a ground metal layer to form a large ground plane with a small silicon area. In some embodiments, the integrated antenna structure comprises an excitable element comprising an upper metal. An on-chip ground plane comprising a lower metal layer, located on a first side of an interposer substrate, is positioned below the excitable element. A compensation ground plane comprising a conductive structure, located on an opposing side of the interposer substrate, is connected to the ground plane by one or more through-silicon vias (TSVs) that extend through the interposer substrate. The on-chip ground plane and the compensation ground collectively act as a ground plane to reflect electromagnetic radiation generated by the excitable element. Since the thickness of the interposer substrate is relatively low (e.g., approximately $\frac{1}{5}^{th}$ the thickness of a another CMOS substrate) the signal loss due to the interposer substrate is relatively low so that the conductive backside structure improves performance of the on-chip ground plane.

FIG. 1 illustrates a block diagram of some embodiments of a disclosed integrated antenna structure 100.

The integrated antenna structure 100 comprises an interposer substrate 106 having a first side 106a and a second side 106b. An excitable element 102 is located above the first side 106a of the interposer substrate 106. The excitable element 102 is configured to generate electromagnetic radiation that wirelessly propagates outward from the excitable element 102.

An on-chip ground plane 104, comprising a conductive material, is positioned between the excitable element 102 and the interposer substrate 106. The on-chip ground plane 104 is electrically connected to a compensation ground 110 (i.e., an off chip ground plane) configured to operate collectively with the on-chip ground plane as a ground plane of the integrated antenna structure 100. In other words, the compensation ground 110 and the on-chip ground plane 104 operate as first and second ground planes that collectively reflect electromagnetic radiation output from the excitable element 102.

The compensation ground 110 located below the second side 106b of the interposer substrate 106 by way of one or more through-silicon vias (TSVs) 108. Collectively, the on-chip ground plane 104 and the compensation ground 110 act to reflect the electromagnetic radiation generated by the excitable element 102. In some embodiments, the on-chip ground plane 104 and the compensation ground 110 are connected to an electrical ground terminal.

In some embodiments, the excitable element 102 and the on-chip ground plane 104 may comprise metal interconnect layers disposed within one or more dielectric layers located on the interposer substrate 106. For example, the excitable element 102 may be disposed within a first dielectric layer located over the interposer substrate 106 and the on-chip ground plane 104 may be disposed within a second dielectric layer located over the interposer substrate 106. In other embodiments, the excitable element 102 and the on-chip ground plane 104 may comprise metal interconnect layers disposed within one or more dielectric layers located on an integrated chip die connected to the interposer substrate 106 by way of one or more micro-bumps.

Since the thickness of the interposer substrate 106 is relatively low (e.g., approximately $\frac{1}{7}^{th}$ the thickness of a another CMOS substrate, in some embodiments) the signal loss between the excitable element 102 and the compensation ground 110 is also relatively low, thereby allowing the compensation ground 110 to improve the performance of the on-chip ground plane 104. By using the compensation ground 110 to improve the performance of the on-chip ground plane 104, the size of the on-chip ground plane 104 can be kept relatively small, thereby keeping the cost of the disclosed integrated antenna structure relatively low.

Figure 2:
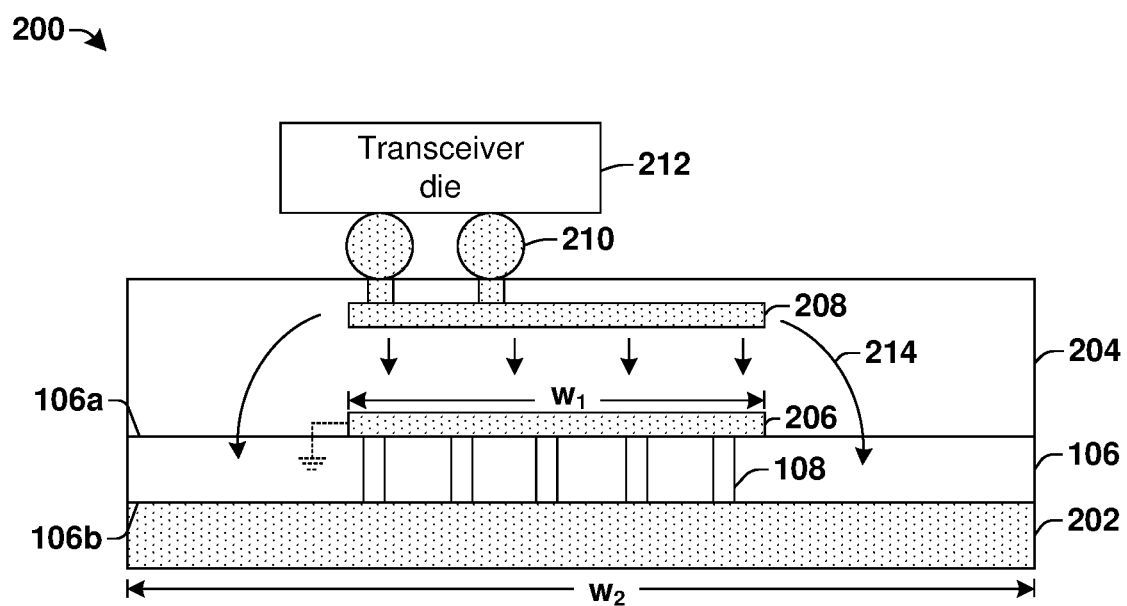
FIG. 2 illustrates a block diagram of some additional embodiments of a semiconductor module comprising a disclosed integrated antenna structure.

FIG. 2 illustrates a block diagram of some additional embodiments of a semiconductor module 200 comprising a disclosed integrated antenna structure.

The semiconductor module 200 comprises an interposer substrate 106. In various embodiments, the interposer substrate 106 may comprise a glass interposer substrate or a silicon interposer substrate. The interposer substrate 106 may have a thickness in a range of between approximately 60 microns and approximately 100 microns. Such a thickness provides for a relatively small loss of electromagnetic radiation as it passes through the interposer substrate 106 (e.g., in comparison to a silicon wafer having a thickness of approximately 700 microns).

A conductive backside structure 202 is located along a second side 106b of the interposer substrate 106. In some embodiments, the conductive backside structure 202 may comprise a backside metal layer formed on the second side 106b of the interposer substrate 106. In other embodiments, the conductive backside structure 202 may comprise a printed circuit board (PCB) connected to the interposer substrate 106, an alternative type of board connected to the interposer substrate 106, or an underlying package substrate comprising a conductive layer connected to the interposer substrate 106.

One or more metal layers may be disposed within a dielectric layer 204 located along the first side 106a of the interposer substrate 106, wherein the first side 106a of the interposer substrate 106 opposes the second side 106b of the interposer substrate 106. In some embodiments, the one or more metal layers may be disposed within a plurality of dielectric layers located along the first side 106a of the interposer substrate 106. In some embodiments, the one or more metal layers comprise a lower metal layer 206 configured to operate as an on-chip ground plane and an upper metal layer 208 configured to operate as an excitable element. Since the lower metal layer 206 and the conductive backside structure 202 are electrically connected to one another they are held at a same electric potential. Therefore, the lower metal layer 206 and the conductive backside structure 202 are able to collectively operate as a ground plane, allowing the lower metal layer 206 to be made relatively small.

In some embodiments, the lower metal layer 206 has a width $w_1$ that is less than that of the width $w_2$ of the conductive backside structure 202. For example, the use of the conductive backside structure 202 may allow for the upper metal layer 208 and the lower metal layer 206 to have a substantially equal width (e.g., of approximately 5 micron), while the conductive backside structure 202 has a significantly larger width (e.g., of approximately 30 micron). The upper metal layer 208 and the lower metal layer 206 can be made to have a same width since the lower metal layer 206 is connected to the conductive backside structure 202, which increases a width of the ground plane. Forming the lower metal layer 206 to have the same width as the upper metal layer 208 provides for a relatively small lower metal layer 206 that allows for the integrated antenna structure to consume a small silicon area that reduces cost of the semiconductor module 200.

In some embodiments the lower and upper metal layers, 206 and 208, comprise copper metal interconnect layers. In some embodiments, the lower metal layer 206 comprises a bottom, first metal interconnect layer within a bottom position of a back-end-of-the-line (BEOL) metallization stack, while the upper metal layer 208 comprises a top metal interconnect layer located at a top position within the BEOL metallization stack. In various embodiments, the one or more metal layers may comprise additional metal interconnect layers located between the lower metal layer 206 and the upper metal layer 208.

The lower metal layer 206 is electrically connected to the conductive backside structure 202 by way of one or more through-silicon vias (TSVs) 108. The one or more TSVs 108 comprise a conductive material that provides vertical electrical connections extending through the interposer substrate 106. In some embodiments, the conductive material comprises copper metal. In other embodiments, the conductive material may comprise aluminum, tungsten, or other similar metals, for example.

In some embodiments, the upper metal layer 208 is connected to a transceiver die 212 by way of one or more micro-bumps 210 disposed between the upper metal layer 108 and the transceiver die 212. Compared to flip-chip C4 (controlled collapse chip connection) solder balls, which are solder bumps used to connect metal terminals disposed over an area of an integrated chip to an external circuitry (e.g., a package substrate), the one or more micro-bumps 210 provide for a smaller bump size (e.g., 10 microns-70 microns) and a tighter pitch (e.g., 10 microns-80 microns). In some embodiments, the transceiver die 212 comprises a monolithic microwave integrate circuit (MMIC) chip configured to generate a signal that is provided to the upper metal layer 208 (e.g., by way of the one or more micro-bumps). In various embodiments, the MMIC chip may comprise a mixer configured to perform microwave mixing, one or more filters configured to perform filtering of the mixed signal, a power amplifier configured to perform power amplification, etc.

During operation, the transceiver die 212 is configured to provide a wireless signal-to-be-transmitted that causes the upper metal layer 208 to act as a radiating element and that causes an electric field 214 to be formed between the radiating upper metal layer 208, and the lower metal layer 206 (i.e., the on-chip ground plane) and the conductive backside structure 202 (i.e., the compensation ground). The electric field 214 resonates between the upper metal layer 208, and the lower metal layer 206 and the conductive backside structure 202 at a fundamental mode of the integrated antenna structure according to a radiation pattern that is a function of a combination of the upper metal layer 208 and the lower metal layer 206 and the conductive backside structure 202. The radiating signals form standing waves between the upper metal layer 208 and the lower metal layer 206 and the conductive backside structure 202, which "leak" out the ends of the integrated antenna structure.

Figure 3:
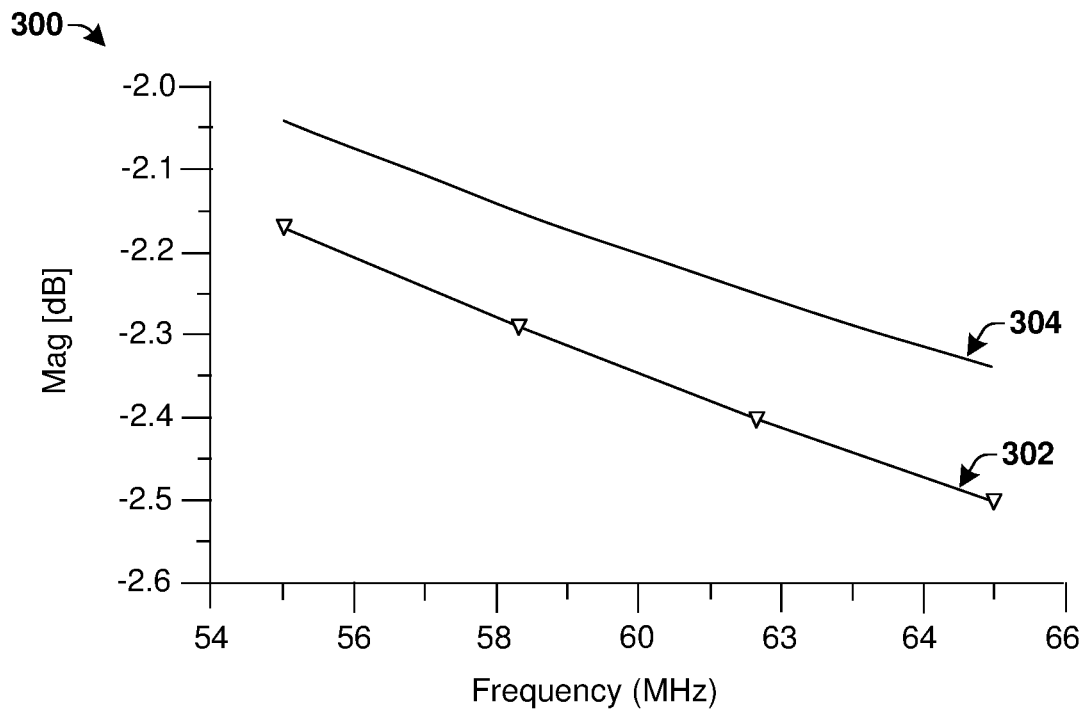
FIG. 3 illustrates a graph showing simulation results of the gain of a disclosed integrated antenna as a function of frequency.

By forming the ground plane using an on-chip ground plane (e.g., lower metal layer 206) and a compensation ground (e.g., the conductive backside structure 202), the size (e.g., width $w_1$) consumed by the on-chip ground plane can be reduced, while maintaining a ground plane having a similar size due to the impact of the compensation ground. For example, FIG. 3 illustrates a graph 300 showing simulation results of the gain of a disclosed integrated antenna (y-axis) as a function of frequency (x-axis). In graph 300, the gain of the disclosed integrated antenna having a compensation ground and an on-chip ground plane is illustrated by trend line 304, while the gain of a disclosed integrated antenna having a larger on-chip ground plane with no compensation ground is illustrated by trend line 302. The gain of the disclosed integrated antenna (trend line 304) is less than the gain of an integrated antenna having a larger on-chip ground plane. For example, at a frequency of 55 MHz the gain of the disclosed integrated antenna is approximately −2.05 dB, while the gain of an integrated antenna having no compensation ground is approximately −2.15 dB.

One of ordinary skill in the art will appreciate that operation of the disclosed integrated antenna structure is dependent on its dimensions and that the dimensions of the on-chip ground plane and compensation ground plane can change depending on a number of parameters, including the frequency of operation and the type of antenna. For example, in a disclosed integrated chip structure comprising a patch antenna, a length of an upper metal layer (e.g., corresponding to upper metal layer 208) may be approximately equal to a one half of a wavelength of a transmitted signal and a width of the upper metal layer can be chosen to provide a desired input impedance (e.g., 50 ohms). In some embodiments, the dimensions of the disclosed integrated antenna structure are obtained by the use of simulation tools that provide a radiation pattern of an integrated antenna structure. For example, in some embodiments an integrated antenna design comprising a conductive backside structure 202, a lower metal layer 206, and an upper metal layer 208 may input into a simulation tool comprising a software program. The simulation tool may be used to calculate metrics such as gain, directivity, input impedance, efficiency, and near-field and/or far-field radiation patterns (e.g., as a 2D plot or a 3D plot) based upon the physical layout of an integrated antenna. From the calculated metrics, a designer can change dimensions of the integrated antenna design to achieve desired metrics.

It will also be appreciated that the gain achieved by the disclosed integrated antenna can be varied depending on the dimensions of the on-chip ground plane and the compensation ground. For example, in some embodiments, an integrated antenna may achieve a gain of −6 dBi using an on-chip ground plane having a dimension of 1.3 mm×1.3 mm. Using a reduced size on-chip ground plane of 0.9 mm×0.4 mm reduces the gain of the integrated antenna to a value of −7.2 dBi. However, a disclosed integrated antenna, using a compensation ground having dimensions of 1.3 mm×1.3 mm with the reduced size on-chip ground plane provides for an improvement in the gain over the original integrated antenna by 1.6 dB (i.e., to a value of −4.4 dBi).

Figure 4A:
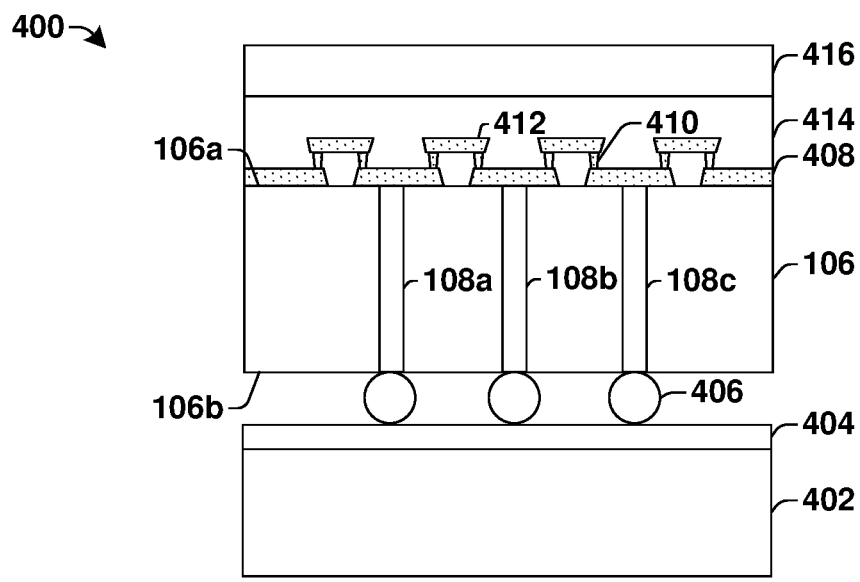
FIGS. 4A-4B illustrate some embodiments of a semiconductor module comprising a disclosed integrated antenna structure.
Figure 4B:
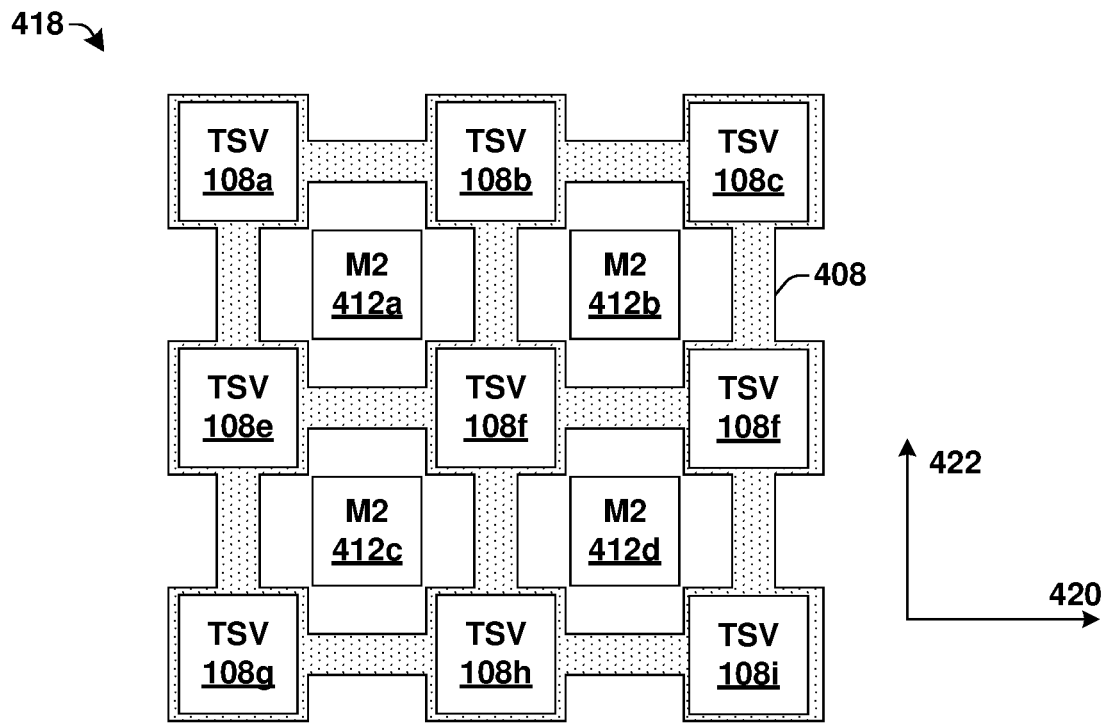

FIGS. 4A-4B illustrate some embodiments of a semiconductor module comprising a disclosed integrated antenna structure.

FIG. 4A illustrates a cross-sectional view of a disclosed integrated antenna structure 400. The integrated antenna structure 400 comprises a substrate 402. In some embodiments, the substrate 402 may comprise a printed circuit board. A backside metal layer 404 that acts as a compensation ground is located on the substrate 402. In various embodiments, the backside metal layer 404 may comprise a conductive material such as copper, tungsten, or aluminum.

One or more solder balls 406 are configured to physically connect the substrate 402 to an interposer substrate 106. In some embodiments, the one or more solder balls 406 may comprise flip-chip C4 (controlled collapse chip connection) solder bumps, as described above. The one or more solder balls 406 are connected to through-silicon vias (TSVs) 108a-108c that extend though the interposer substrate 106. The one or more TSVs 108 are electrically connected to a first metal interconnect layer 408 that acts as an on-chip ground plane. The first metal interconnect layer 408 is disposed within one or more dielectric layers 414 located on the interposer substrate 106. The backside metal layer 404 and the first metal interconnect layer 408 are configured to operate as a ground plane.

In some embodiments, a second metal interconnect layer 412, located within the one or more dielectric layers 414, is used to compensate for design rule limitations on the first metal layer 408. For example, if the first metal interconnect layer 408 is restricted to have a maximum metal width and/or minimum spacing by design rules, the second metal interconnect layer 412 can be used to fill in spaces in the first metal interconnect layer 408 to improve performance of the on-chip ground plane (i.e., the first metal interconnect layer 408 along with the second metal interconnect metal layer 412, collectively acts as an on-chip ground plane). The second metal interconnect layer 412 is connected to the first metal interconnect layer 408 by way of one or more vias 410, and is located at a position that is laterally between structures of the first metal interconnect layer 408.

An upper metal interconnect layer 416 is located at a position vertically separated from the first metal interconnect layer 408. The upper metal interconnect layer 416 is configured to operate as an excitable element that radiates a wireless electromagnetic signal.

FIG. 4B illustrates a top view 418 of the integrated antenna structure 400. As illustrated in top view 418, the first metal interconnect layer 408 has a pattern that is symmetric about an x-axis 420 and a y-axis 422. The one or more TSVs 108a-108i are connected to the first metal interconnect layer 408.

The second metal interconnect layer 412a-412d is positioned between structures of the first metal interconnect layer 408. By placing the second metal interconnect layer 412a-412d between structures of the first metal interconnect layer 408, the first metal interconnect layer 408 and the second metal interconnect layer 410 can collectively form an on-chip ground plane having a higher design density (e.g., less holes) than that of the first metal layer 408.

It will be appreciated that the disclosed integrated antenna structure is not limited to a particular type of antenna, but instead the disclosed integrated antenna structure may comprise various types of antennas. For example, in various embodiments, the disclosed integrated antenna structure may comprise a loop antenna, a patch antenna, a dipole antenna, or an array of such antennas.

Figure 5:
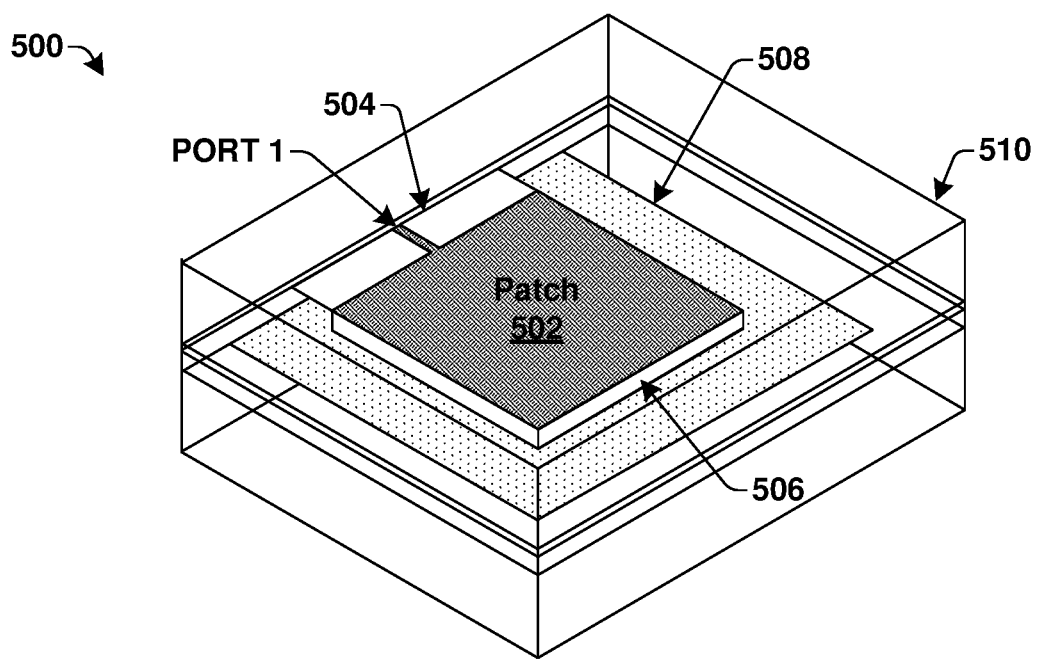
FIG. 5 illustrates a three-dimensional illustration of some embodiments of a semiconductor module comprising a disclosed integrated patch antenna.

For example, FIG. 5 illustrates a three-dimensional view of an integrated antenna comprising an integrated patch antenna 500.

The integrated patch antenna 500 comprises a patch 502 comprising a flat rectangular sheet of conductive material (e.g., a metal). The patch 502 is configured to receive a signal to be transmitted by way of an input port (i.e., input feed), PORT 1, and to wirelessly radiate the signal to be transmitted. The patch 502 is located over an on-chip ground plane 504 having a larger size than the patch 502. The on-chip ground plane 504 is positioned over an interposer substrate 506 that is connected to an underlying compensation ground 508. The on-chip ground plane 504 and the compensation ground 508 are electrically connected together to collectively operate as a ground plane that reflects electromagnetic radiation radiated from the patch 502.

The patch 502, the on-chip ground plane 504, the interposer substrate 506, and the compensation ground 508 are located within an integrated chip package 510. In some embodiments, the integrated chip package 510 may comprise a package molding compound formed around the patch 502, the on-chip ground plane 504, the interposer substrate 506, and the compensation ground 508. The package molding compound may comprise an organic polymer, such as an epoxy material that has an inorganic filling material (e.g., silicon dioxide).

Figure 6:
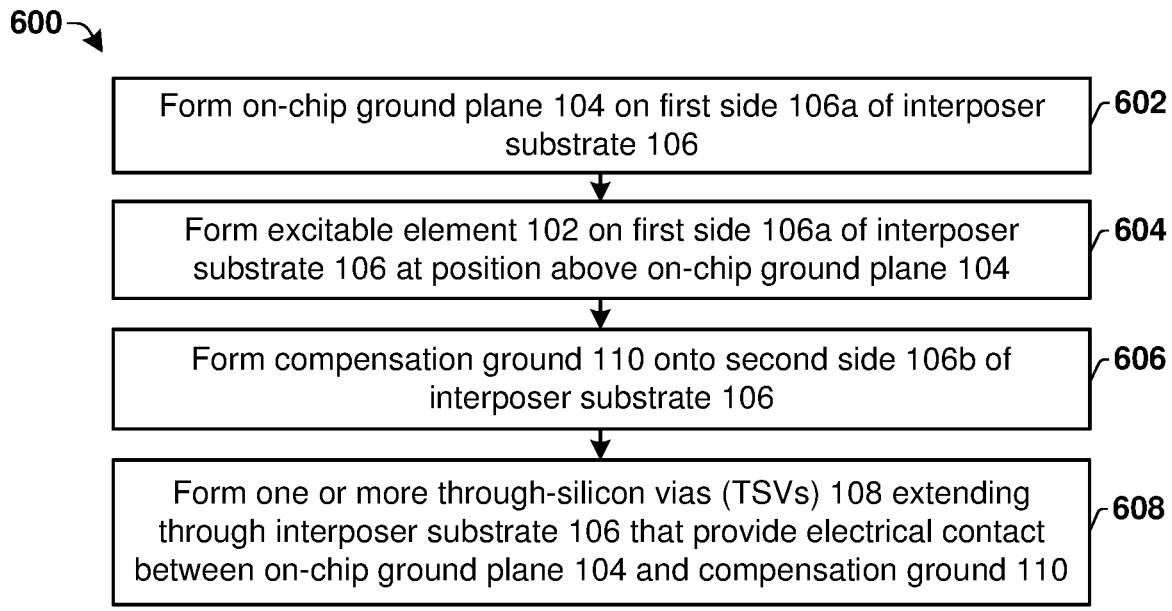
FIGS. 6-9 are flow diagrams illustrating some embodiments of various methods of forming a semiconductor module comprising a disclosed integrated antenna structure.

FIG. 6 is a flow diagram illustrating some embodiments of a method 600 of forming a semiconductor module comprising a disclosed integrated antenna structure 100.

It will be appreciated that while the disclosed methods (e.g., methods 600, 700, 800, and 900) are illustrated and described as a series of acts or events, that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases. Furthermore, although reference in made in the method to previous figures and/or reference numbers, it will be appreciated that the method is not limited to such figures and/or reference numbers.

At act 602, an on-chip ground plane 104 is formed on a first side 106*a* of the interposer substrate 106.

At act 604, an excitable element 102 is formed on the first side 106*a* of the interposer substrate 106 at a position above the on-chip ground plane 104.

At act 606, a compensation ground 110 is formed onto a second side 106*b* of an interposer substrate 106 that opposes the first side 106*a* of the interposer substrate 106.

At act 608, one or more through-silicon vias (TSVs) 108 are formed to extend though the interposer substrate 106. The one or more TSV 108 comprise a conductive metal that provides an electrical connection between the on-chip ground plane 104 located on the first side 106*a* of the interposer substrate 106 and the compensation ground 110 located on the second side 106*b* of the interposer substrate 106.

Figure 7:
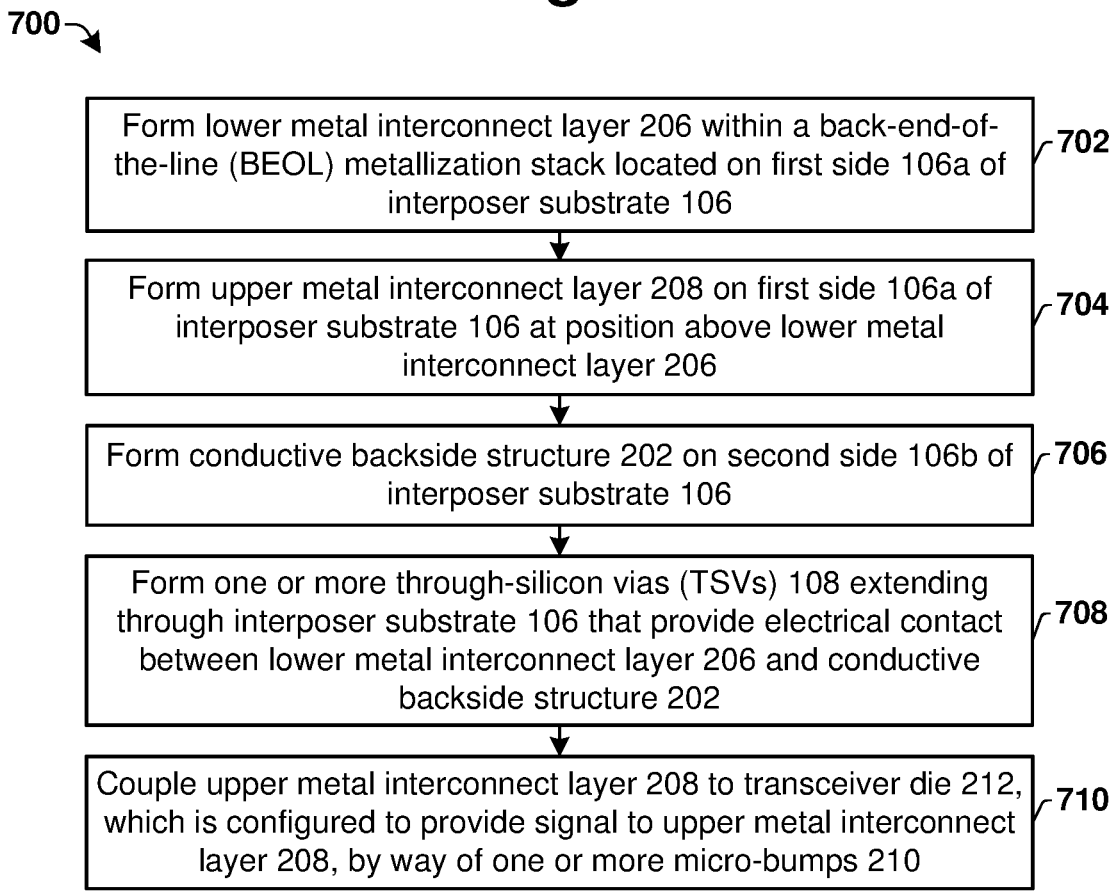

FIG. 7 is a flow diagram illustrating some embodiments of an alternative method 700 of forming a semiconductor module 200 comprising a disclosed integrated antenna structure.

At act 702, a lower metal interconnect layer 206 within a back-end-of-the-line (BEOL) metallization stack is formed on a first side 106*a* of the interposer substrate 106.

At act 704, an upper (e.g., top) metal interconnect layer 208 is formed on first side 106*a* of interposer substrate within the back-end-of-the-line (BEOL) metallization stack at a position above the lower metal interconnect layer 206.

At act 706, a conductive backside structure 202 is formed onto a second side 106*b* of an interposer substrate 106 that opposes the first side 106*a* of the interposer substrate 106. In various embodiments, the conductive backside structure 202 may comprise a backside metal layer formed on the second side 106*b* of the interposer substrate 106, a printed circuit board connected to the interposer substrate 106, or an underlying substrate connected to the interposer substrate 106.

At act 708, one or more through-silicon vias (TSVs) 108 are formed to extend though the interposer substrate 106. The one or more TSV 108 comprise a conductive metal that provides an electrical connection between the lower metal interconnect layer 206 located on the first side 106*a* of the interposer substrate 106 and the conductive backside structure 202 located on the second side 106*b* of the interposer substrate 106.

At act 710, the upper metal interconnect layer 208 is coupled to a transceiver die 212 by way of one or more micro-bumps 210 disposed between the upper metal layer 108 and the transceiver die 212. The transceiver die 212 is configured to provide a signal to the upper metal layer 208.

Figure 8:
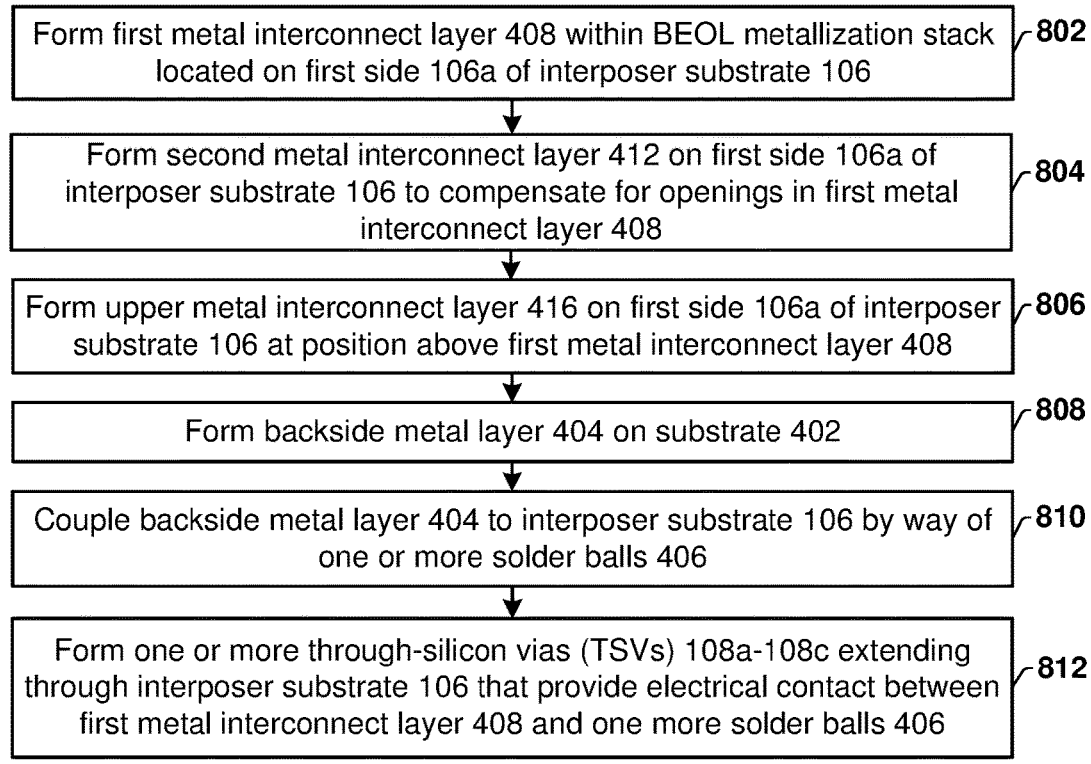

FIG. 8 is a flow diagram illustrating some embodiments of an alternative method 800 of forming a semiconductor module comprising a disclosed integrated antenna structure 400.

At act 802, a first metal interconnect layer 408 is formed within a back-end-of-the-line (BEOL) metallization stack located on a first side 106*a* of the interposer substrate 106. In some embodiments, the first metal interconnect layer 408 may be formed within one or more dielectric layers 414 disposed on the first side of the interposer substrate 106.

At act 804, a second metal interconnect layer 412 is formed on the first side 106*a* of the interposer substrate 106 to compensate for openings in the first metal interconnect layer 408 (e.g., due to ground rule limitations). In some embodiments, the second metal interconnect layer 412 may be formed within the one or more dielectric layers 414 and connected to the first metal interconnect layer 208 by way of one or more vias 410.

At act 806, an upper metal interconnect layer 416 is formed within the back-end-of-the-line (BEOL) metallization stack at a position above the first metal interconnect layer 408.

At act 808, a backside metal layer 404 is formed on a substrate 402.

At act 810, the backside metal layer 404 is coupled to a second side 106*b* of the interposer substrate 106 by way of one or more solder balls 406.

At act 812, one or more through-silicon vias (TSVs) 108*a*-108*c* are formed to extend though the interposer substrate 106. The one or more TSV 108*a*-108*c* comprise a conductive metal that provides an electrical connection between the first metal interconnect layer 408 and the backside metal layer 404.

Figure 9:
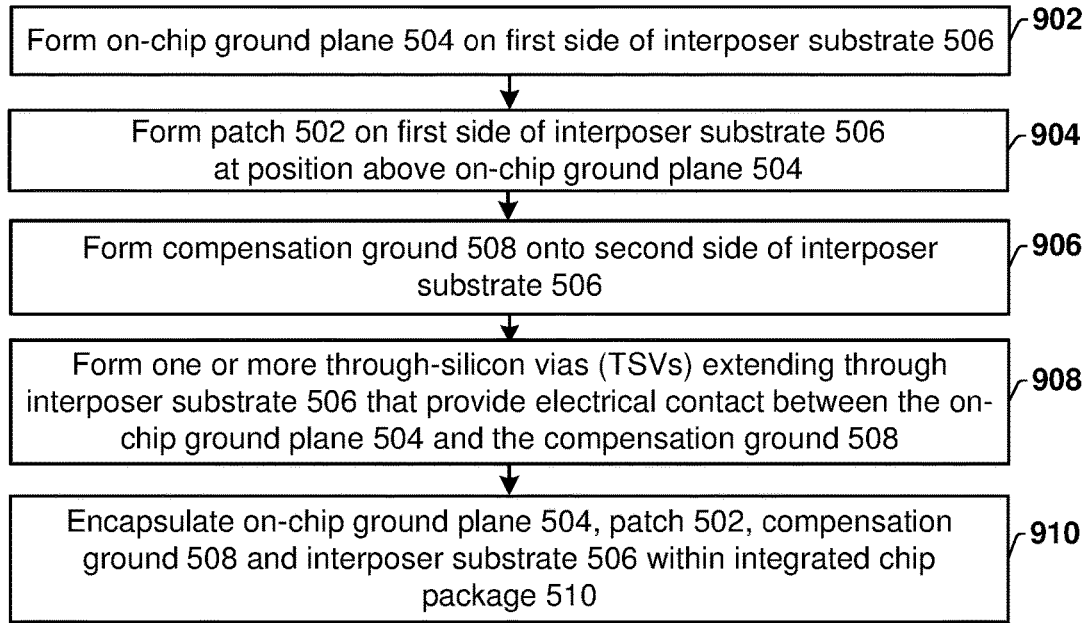

FIG. 9 is a flow diagram illustrating some embodiments of an alternative method 900 of forming a semiconductor module comprising a disclosed integrated antenna structure 500.

At act 902, an on-chip ground plane 504 is formed on a first side of the interposer substrate 506.

At act 904, a patch 502 is formed on the first side of the interposer substrate 506 at a position above the on-chip ground plane 504.

At act 906, a compensation ground 508 is formed onto a second side of the interposer substrate 506 that opposes the first side of the interposer substrate 506.

At act 908, one or more through-silicon vias (TSVs) are formed to extend though the interposer substrate 506 to provide an electrical connection between the on-chip ground plane 504 and the compensation ground 508.

At act 910, the on-chip ground plane 504, the patch 502, the compensation ground 508, and the interposer substrate 506 are encapsulated within an integrated chip package 510. In some embodiments, the integrated chip package 510 may comprise a package molding compound comprising an organic polymer, such as an epoxy material that has an inorganic filling material (e.g., silicon dioxide).

Although the disclosure has been shown and described with respect to a certain aspect or various aspects, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the disclosure. In addition, while a particular feature of the disclosure may have been disclosed with respect to only one of several aspects of the disclosure, such feature may be combined with one or more other features of the other aspects as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

Therefore, in some embodiments the present disclosure relates to a semiconductor module comprising a low-cost integrated antenna that uses a conductive backside structure in conjunction with a ground metal layer to form a large ground plane with a small silicon area.

In some embodiments, the present disclosure relates to semiconductor module having an integrated antenna structure. The semiconductor module includes an excitable element, and a first ground plane disposed between a substrate and the excitable element. A second ground plane is separated from the first ground plane by the substrate. The second ground plane is coupled to the first ground plane by one or more through-substrate vias (TSVs) that extend through the substrate.

In another embodiment, the present disclosure relates to a semiconductor module. The semiconductor module includes an excitable element configured to radiate electromagnetic radiation. A ground plane is disposed between a substrate and the excitable element, and a conductive structure is separated from the ground plane by the substrate. The conductive structure is electrically coupled to the ground plane.

In yet another embodiment, the present disclosure relates to a semiconductor module. The semiconductor module includes an excitable element configured to radiate electromagnetic radiation. A first ground plane is disposed between a substrate and the excitable element, and a second ground plane separated from the excitable element by the first ground plane. The second ground plane is electrically coupled to the first ground plane.

What is claimed is:

1. A semiconductor module, comprising:
an excitable element located on a first side of a substrate;
a first ground structure disposed between the first side of the substrate and the excitable element, wherein the first ground structure comprises a conductive via extending through the substrate and an interconnect disposed over both the first side of the substrate and a topmost surface of the conductive via facing away from the substrate; and
a second ground structure located on a second side of the substrate, opposing the first side, and electrically coupled to the first ground structure.

2. The semiconductor module of claim 1, further comprising
a dielectric structure disposed on the first side of the substrate and laterally surrounding the interconnect.

3. The semiconductor module of claim 2, wherein the interconnect is disposed on a first interconnect wire layer that is a closest interconnect wire layer to the first side of the substrate.

4. The semiconductor module of claim 3, wherein the excitable element is disposed on a second interconnect wire layer that is laterally surrounded by the dielectric structure, the second interconnect wire layer being a furthest interconnect wire layer from the first side of the substrate.

5. The semiconductor module of claim 1, wherein the second ground structure is arranged on a printed circuit board or a package substrate.

6. The semiconductor module of claim 1, wherein the first ground structure further comprises a second interconnect, the interconnect disposed vertically between the first side of the substrate and the second interconnect.

7. The semiconductor module of claim 1, further comprising
a transceiver die coupled to the excitable element by way of one or more micro-bumps disposed between the excitable element and the transceiver die, wherein the transceiver die is configured to generate a signal to be transmitted wirelessly by the excitable element.

8. An integrated antenna structure, comprising:
a first interconnect wire disposed within a dielectric structure arranged along a first side of a semiconductor substrate that is a semiconductor material;
a second interconnect wire disposed within the dielectric structure and separated from the semiconductor substrate by the first interconnect wire, wherein the second interconnect wire is configured to wirelessly transmit a signal; and
a conductive structure arranged along a second side of the semiconductor substrate opposing the first side, wherein the conductive structure is electrically coupled to the first interconnect wire.

9. The integrated antenna structure of claim 8, further comprising:
a third interconnect wire disposed between the first interconnect wire and the second interconnect wire, wherein the third interconnect wire is coupled to the first interconnect wire by way of one or more interconnect vias respectively having a bottommost surface over the first interconnect wire; and
wherein the first interconnect wire extends in a closed path around an opening extending through the first interconnect wire, the third interconnect wire being disposed over the opening.

10. The integrated antenna structure of claim 8, wherein the first interconnect wire and the conductive structure are configured to reflect a part of the signal to be wirelessly transmitted by the second interconnect wire.

11. The integrated antenna structure of claim 8, further comprising:
a through-substrate via (TSV) extending through the semiconductor substrate and configured to electrically couple the first interconnect wire to the conductive structure.

12. The integrated antenna structure of claim 11, further comprising:
a conductive bump structure disposed between a bottom of the TSV and a top of the conductive structure.

13. The integrated antenna structure of claim 8, further comprising:
a transceiver circuit coupled to the second interconnect wire, wherein the transceiver circuit is configured to output the signal to be wirelessly transmitted by the second interconnect wire.

14. The integrated antenna structure of claim 8, wherein the conductive structure laterally extends past opposing outermost sidewalls of the second interconnect wire.

15. The integrated antenna structure of claim 8, wherein the conductive structure laterally extends past opposing outermost sidewalls of the semiconductor substrate.

16. The integrated antenna structure of claim 8, wherein the signal to be wirelessly transmitted is configured to cause the second interconnect wire to form an electric field between the second interconnect wire and both the first interconnect wire and the conductive structure.

17. A method of forming an integrated antenna structure, comprising:
forming one or more interconnects within a first dielectric layer on a first side of a semiconductor substrate;
forming an excitable element within a second dielectric layer over the one or more interconnects, wherein the excitable element is configured to transmit a wireless signal; and
bonding the one or more interconnects to a conductive structure on a second side of the semiconductor substrate by way of a conductive bump structure.

18. The method of claim 17, further comprising:
forming a through-substrate via (TSV) extending through the semiconductor substrate, wherein the TSV is coupled between the one or more interconnects and the conductive bump structure.

19. The method of claim 17, wherein the conductive structure laterally extends past opposing outermost sidewalls of both the one or more interconnects and the excitable element.

20. The method of claim 17, wherein the one or more interconnects and the conductive structure are collectively configured to act as a ground plane configured to reflect a transmitted wireless signal generated by the excitable element.

* * * * *